United States Patent
Fuhrmann et al.

(10) Patent No.: US 9,741,874 B2
(45) Date of Patent: Aug. 22, 2017

(54) SCALABLE VOLTAGE SOURCE

(71) Applicant: AZUR SPACE Solar Power GmbH, Heilbronn (DE)

(72) Inventors: Daniel Fuhrmann, Heilbronn (DE); Victor Khorenko, Neuenstadt a.K. (DE); Wolfgang Guter, Stuttgart (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/268,884

(22) Filed: Sep. 19, 2016

(65) Prior Publication Data
US 2017/0084757 A1 Mar. 23, 2017

(30) Foreign Application Priority Data
Sep. 19, 2015 (DE) .................. 10 2015 012 007

(51) Int. Cl.
*H01L 29/00* (2006.01)
*H01L 31/00* (2006.01)
(Continued)

(52) U.S. Cl.
CPC ............ *H01L 29/88* (2013.01); *H01L 29/205* (2013.01); *H01L 31/02019* (2013.01);
(Continued)

(58) Field of Classification Search
CPC ....... H01L 29/20; H01L 29/068; H01L 29/88; H01L 29/205; H01L 31/0689; H01L 31/0725; H01L 31/0693
See application file for complete search history.

(56) References Cited

U.S. PATENT DOCUMENTS 4,127,862 A   11/1978  Ilegems et al.
6,239,354 B1   5/2001  Wanlass
(Continued)

FOREIGN PATENT DOCUMENTS

DE   10 2010 001 420 A1   8/2011
EP        1 936 700 A2     6/2008
EP        3 096 361 A1    11/2016

OTHER PUBLICATIONS

Valdivia et al., "Five-volt vertically-stacked, single-cell GaAs photonic power converter," Proc. of SPIE, vol. 9358, pp. 93580E-1-93580E-8 (Mar. 16, 2015).
(Continued)

*Primary Examiner* — Nikolay Yushin
(74) *Attorney, Agent, or Firm* — Muncy, Geissler, Olds & Lowe, P.C.

(57) ABSTRACT

A scalable voltage source having a number N of partial voltage sources implemented as semiconductor diodes connected to one another in series, wherein each of the partial voltage sources has a semiconductor diode with a p-n junction. A tunnel diode is formed between sequential pairs of partial voltage sources, wherein the tunnel diode has multiple semiconductor layers with a larger band gap than the band gap of the p/n absorption layers and the semiconductor layers with the larger band gap are each made of a material with modified stoichiometry and/or a different elemental composition than the p/n absorption layers of the semiconductor diode. The partial voltage sources and the tunnel diodes are monolithically integrated together, and jointly form a first stack with a top and a bottom, and the number N of partial voltage sources is greater than or equal to two.

19 Claims, 3 Drawing Sheets

(51) Int. Cl.
- *H01L 29/88* (2006.01)
- *H01L 29/205* (2006.01)
- *H01L 31/02* (2006.01)
- *H01L 31/0304* (2006.01)
- *H01L 31/0687* (2012.01)
- *H01L 31/0693* (2012.01)

(52) U.S. Cl.
CPC .... *H01L 31/03046* (2013.01); *H01L 31/0687* (2013.01); *H01L 31/0693* (2013.01)

(56) References Cited

U.S. PATENT DOCUMENTS

| | | | |
|---|---|---|---|
| 7,202,102 B2 * | 4/2007 | Yao | H01L 31/03046 257/E21.125 |
| 8,742,251 B2 | 6/2014 | Werthen et al. | |
| 2005/0017317 A1 * | 1/2005 | Yao | H01L 31/03046 257/439 |
| 2006/0048811 A1 | 3/2006 | Krut et al. | |
| 2015/0162478 A1 | 6/2015 | Fafard et al. | |
| 2016/0343704 A1 | 11/2016 | Fuhrmann et al. | |

OTHER PUBLICATIONS

J. Schubert, et al., "High-Voltage GaAs Photovoltaic Laser Power Converters", IEEE Transactions on Electron Devices, vol. 56, No. 2, pp. 170-175, ISSN 0018-9383 (Feb. 2009).

Nader M. Kalkhoran, et al., "Cobalt disilicide intercell ohmic contacts for multijunction photovoltaic energy converers", Applied Physics Letters 64(1994), No. 15, pp. 1980-1982, Woodbury, NY, US (Apr. 11, 1994).

Andreas W. Bett, et al., "III-V Solar Cells Under Monochromatic Illumination", Photovoltaic Specialists Conference, PVSC '08. 33$^{rd}$ IEEE, pp. 1-5, ISBN: 978-1-4244-1640-0, Germany (2008).

* cited by examiner

SCALABLE VOLTAGE SOURCE

This nonprovisional application claims priority under 35 U.S.C. §119(a) to German Patent Application No. 10 2015 012 007.7, which was filed in Germany on Sep. 19, 2015, and which is herein incorporated by reference.

BACKGROUND OF THE INVENTION

Field of the Invention

The invention relates to a scalable voltage source.

Description of the Background Art

Scalable voltage sources and also solar cells made of III-V materials are known from U.S. Pat. No. 4,127,862, from U.S. Pat. No. 6,239,354 B1, from DE 10 2010 001 420 A1, from "Cobalt disilicide intercell ohmic contacts for multijunction photovoltaic energy converters," by Nader M. Kalkhoran, et al., Appl. Phys. Lett. 64, 1980 (1994), and from "III-V solar cells under monochromatic illumination," by A. Bett et al., Photovoltaic Specialists Conference, 2008, PVSC '08. 33rd IEEE, page 1-5, ISBN: 978-1-4244-1640-0.

SUMMARY OF THE INVENTION

It is therefore an object of the invention to provide a device that advances the state of the art.

According to an exemplary embodiment of the invention, a scalable voltage source is provided, having a number N of partial voltage sources implemented as semiconductor diodes connected to one another in series, wherein each of the partial voltage sources has a semiconductor diode with a p-n junction, and the semiconductor diode has a p-doped absorption layer, wherein the p absorption layer is passivated by a p-doped passivation layer with a larger band gap than the band gap of the p absorption layer and the semiconductor diode has an n absorption layer, wherein the n absorption layer is passivated by an n-doped passivation layer with a larger band gap than the band gap of the n absorption layer, and the partial source voltages of the individual partial voltage sources have a deviation of less than 20% from one another, and a tunnel diode is formed between sequential pairs of partial voltage sources, wherein the tunnel diode has multiple semiconductor layers with a larger band gap than the band gap of the p/n absorption layers and the semiconductor layers with the larger band gap are each made of a material with modified stoichiometry and/or a different elemental composition than the p/n absorption layers of the semiconductor diode, and the partial voltage sources and the tunnel diodes are monolithically integrated together, and jointly form a first stack with a top and a bottom, and the number N of partial voltage sources is greater than or equal to two, and the light strikes the first stack on the top and the size of the illumination area on the stack top is essentially the size of the area of the first stack at the top, and the first stack has a total thickness of less than 12 µm, and at 300 K the first stack has a source voltage of greater than 2.2 volts as long as the first stack is irradiated with a photon flux, and wherein the total thickness of the p and n absorption layers of a semiconductor diode increases from the topmost semiconductor diode to the bottommost semiconductor diode in the direction of incident light from the top of the first stack to the bottom of the first stack, and a continuous shoulder is formed in the vicinity of the bottom of the first stack and the height of the shoulder is greater than 100 nm.

The term "essentially" in the context of the comparison of the illumination area on the stack top with the size of the area of the first stack at the top can be understood to mean that a difference in the area is, in particular, less than 20%, or preferably less than 10%, or preferably less than 5%, or most preferably the two areas are equal.

It should also be noted that the term "light" for irradiating the stack top can be understood to mean a light that has a spectrum of wavelengths in the absorption range of the absorption layers. It is a matter of course that a monochromatic light that has a certain wavelength, i.e., absorbing wavelength, which is to say a wavelength in the absorption range of the absorption layers, is also suitable.

It is a matter of course that, for example, the entire top of the first stack, which is to say the entire or nearly the entire surface, is irradiated with light of a certain wavelength. It should be noted that thorough investigations have demonstrated, surprisingly, that in contrast to the prior art, source voltages above 2.2V advantageously result with the present monolithic stack approach. It should be noted that the terms diode and semiconductor diode are used synonymously hereinbelow.

An advantage of the device according to the invention is that a simple, economical, and reliable voltage source, a voltage source with voltage values even above three or more volts, can be produced by means of a monolithically integrated structure by series-connecting a plurality of partial voltage sources. Another advantage is that the stacked arrangement results in a great saving in area as compared to the previous lateral arrangement with silicon diodes. In particular, only the considerably smaller receiving area of the stack must be illuminated by the source diode or the light source.

In an improvement, the partial source voltages of the individual partial voltage sources differ from one another by less than 10%. The usability as a scalable voltage source, in particular as a reference voltage source, is substantially improved in this way. It is a matter of course that the term "scalability" refers to the value of the source voltage of the entire stack.

In an improvement, the semiconductor diodes each have the same semiconductor material, wherein the semiconductor material of the diodes has the same crystalline composition and the stoichiometry preferably is nearly the same or preferably is exactly the same. It is also advantageous to arrange the first stack on a substrate. In one embodiment, the semiconductor material and/or the substrate is formed of III-V materials. In particular, it is preferred that the substrate includes germanium or gallium arsenide and/or that the semiconductor layers on the substrate have arsenic and/or phosphorus. In other words, the semiconductor layers include As-containing layers and P-containing layers, which is to say layers of GaAs or AlGaAs or InGaAs as examples of arsenide layers and InGaP as an example of phosphide layers.

A second voltage terminal can be formed on the bottom of the first stack and, in particular, that the second voltage terminal is formed by the substrate.

In an embodiment, the semiconductor diodes are made of the same material as the substrate. An advantage is that the coefficients of expansion, in particular, of the two parts are then the same. It is advantageous when the semiconductor diodes are made fundamentally of one III-V material. In particular, it is advantageous to use GaAs.

In an embodiment, a first voltage terminal is formed on the top of the first stack as a continuous metal contact in the vicinity of the edge or as a single contact area on the edge.

In addition, The first stack can have a base area smaller than 2 mm² or smaller than 1 mm². Investigations have demonstrated that it is advantageous to design the base area to be quadrilateral. For example, the base area of the stack can be square in design.

Additional investigations have demonstrated that, to achieve especially high voltages, it is advantageous to make a second stack and to connect the two stacks to one another in series such that the source voltage of the first stack and the source voltage of the second stack add together. The first stack and the second stack can be arranged next to one another on a shared carrier.

In an embodiment, the source voltage of the first stack differs from the source voltage of the second stack by less than 15%.

In addition, a semiconductor mirror can be formed below the bottommost semiconductor diode of the stack. Investigations have demonstrated that a plurality of stacks can be formed next to one another on a semiconductor wafer or semiconductor slice by the means that so-called mesa etching is performed after full-area, preferably epitaxial, production of the layers. For this purpose, a resist mask is created by means of a masking process and then wet chemical etching preferably is performed to create mesa trenches. The mesa etching preferably stops in the substrate or on the substrate.

In an embodiment, each stack can have, in the vicinity of the bottom, a continuous, step-like edge, wherein, in the case of two directly adjacent stacks, the continuous edge is formed as a shared continuous edge on the outer surfaces of the stack structure so that the voltage source has one continuous edge.

The edge can be stepped or designed as a shoulder. In this context, the surface of the edge or of the shoulder preferably has a mainly flat area, wherein the normal of the surface of the edge or shoulder is parallel or nearly parallel to the normal of the surface of the first stack or the normal of the surfaces of the stack in question. It should be noted that the lateral face of the edge or of the shoulder is largely or exactly perpendicular to the surface of the edge or shoulder. The height of the shoulder is greater than 100 nm, which is to say the continuous lateral face has a height greater than 100 nm in order to achieve sufficient mechanical stability. In particular, the shoulder has a height less than 1000 μm.

In each case, the corner of the edge or shoulder is a minimum of 5 μm and a maximum of 500 μm distant from each of the four lateral faces of the first stack or from the lateral faces of the multiple stacks. The distance from the corner to the immediately adjacent lateral face can be in the range between 10 μm and 300 μm in each case. In particular, the distance is in the range between 50 μm and 250 μm.

The lateral faces of the first stack, and in particular all lateral faces of the stack, can be flat and, for example, vertical or nearly vertical in design. In particular, the normals of lateral faces are at an angle in a range between 80° and 110° in comparison to the normals of the adjacent edge faces or the normals of the stack surfaces, which is to say that the normals of a lateral face and the immediately adjacent edge face are essentially orthogonal to one another. Preferably the angle range is between 85° and 105°.

In an embodiment, an intrinsic layer is formed between the p absorption layer and the n absorption layer in at least one semiconductor diode. In an embodiment, the intrinsic layer is formed at the bottommost semiconductor diode. In an embodiment, the intrinsic layer is formed at all semiconductor diodes. In this context, an intrinsic layer can be understood to mean a semiconductor layer with a doping below $1E16/cm^2$, preferably less than $5E15/cm^2$, most preferably less than $1.5 E15/cm^2$.

In an embodiment, exactly two semiconductor diodes are arranged on a germanium substrate, wherein the semiconductor diodes each include an InGaAs compound lattice-matched to the Ge substrate as absorption material.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
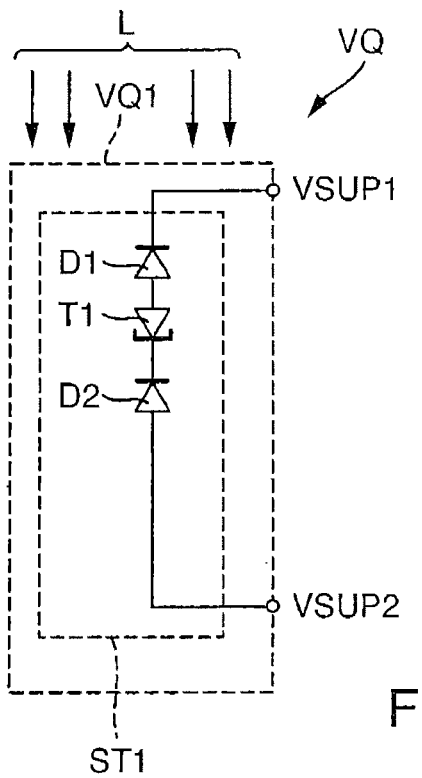
FIG. 1 shows an embodiment according to the invention of a scalable voltage source with one stack and two partial voltage sources.

The illustration in FIG. 1 shows a schematic view of a first embodiment with two partial voltage sources, having a scalable voltage source VQ with a first stack ST1 with a top and a bottom with a number N equal to two diodes. The first stack ST1 has a series circuit having a first diode D1 and a first tunnel diode T1 and a second diode D2. Formed on the top of the stack ST1 is a first voltage terminal VSUP1 and on the bottom of the stack ST1 is a second voltage terminal VSUP2. The source voltage VQ1 of the first stack ST1 in the present case is composed of the partial voltages of the individual diodes D1 to D2 combined. For this purpose, the first stack ST1 is exposed to a photon flux (light) L.

The first stack ST1 of diodes D1 to D2 and the tunnel diode T1 is implemented as a monolithic block, preferably made of the same semiconductor material.

Figure 2:
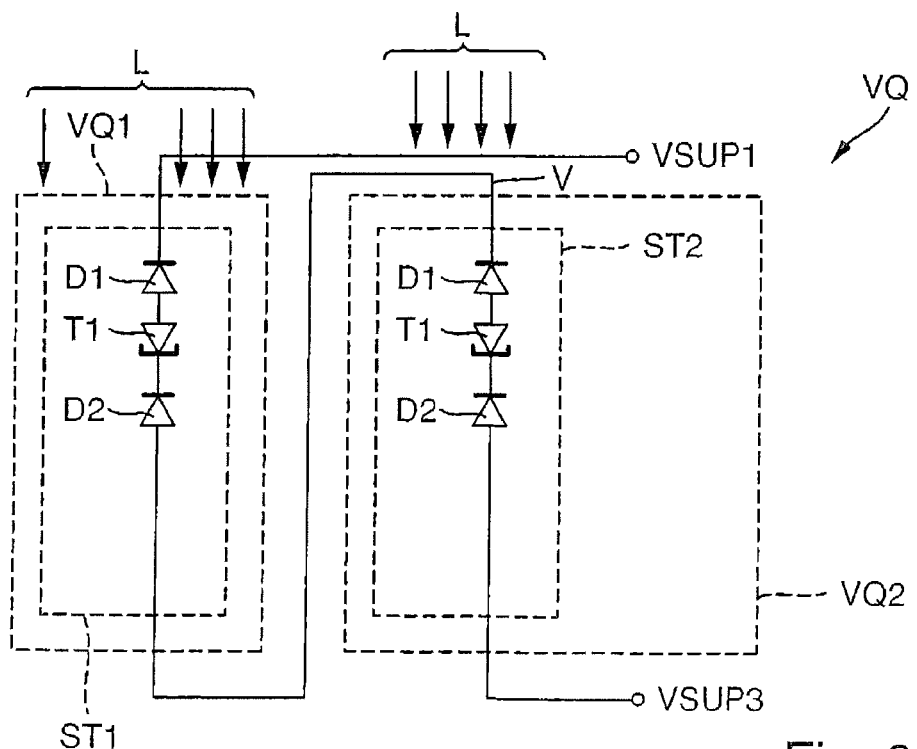
FIG. 2 shows an embodiment of a scalable voltage source with multiple stacks that each have two partial voltage sources.

In the illustration in FIG. 2, another embodiment of an advantageous concatenation of the first stack ST1 and a second stack ST2 is formed. Each of the two stacks ST1 and ST2 has two partial voltage sources. Only the differences from the illustration in FIG. 1 are explained below. The second stack ST2, like the first stack ST1, has a series circuit formed of two diodes with tunnel diodes formed between them. The two stacks ST1 and ST2 are connected in series with one another so that the source voltage VQ1 of the first stack ST1 and the source voltage VQ2 of the second stack ST2 add together as long as the two stacks ST1 and ST2 are exposed to the photon flux L.

Figure 3:
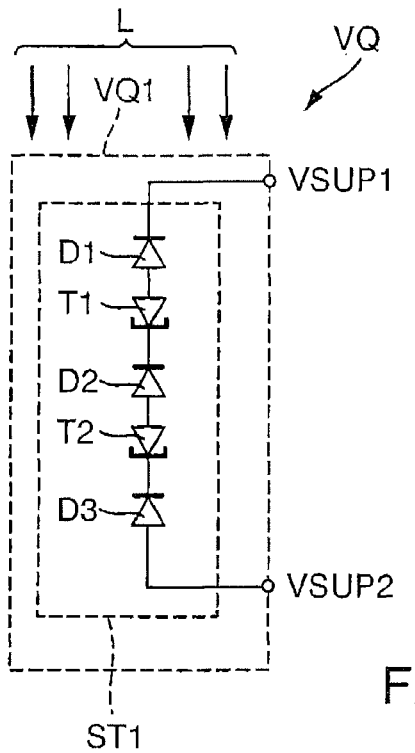
FIG. 3 shows an embodiment according to the invention of a scalable voltage source with one stack having three partial voltage sources.

The illustration in FIG. 3 shows a schematic view of a first embodiment with three partial voltage sources, having the scalable voltage source VQ with the first stack ST1 with the top and the bottom with the number N equal to three diodes. The first stack ST1 has the series circuit formed of the first diode D1 and the first tunnel diode T1 and the second diode D2 and a second tunnel diode T2 and a third diode D3. Formed on the top of the stack ST1 is the first voltage terminal VSUP1 and on the bottom of the stack ST1 is the second voltage terminal VSUP2. The source voltage VQ1 of the first stack ST1 in the present case is composed predominantly of the partial voltages of the individual diodes D1 to D3 combined. For this purpose, the first stack ST1 is exposed to the photon flux L.

The first stack ST1 of diodes D1 to D3 and tunnel diodes T1 and T2 is implemented as a monolithic block, preferably made of the same semiconductor material.

Figure 4:
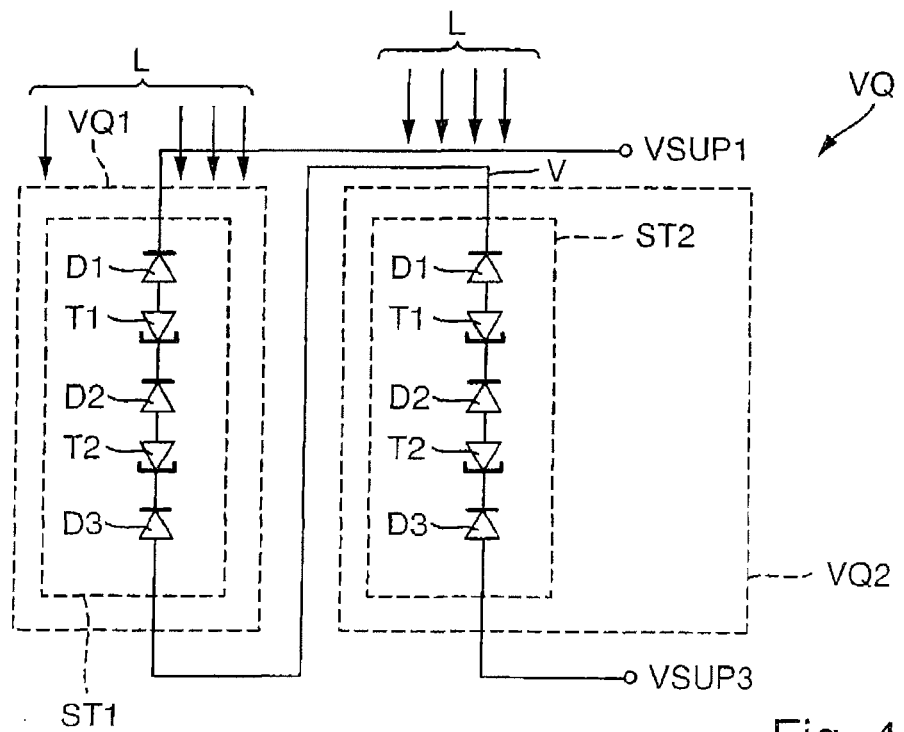
FIG. 4 shows an embodiment of a scalable voltage source with multiple stacks that each have three partial voltage sources.

In the illustration in FIG. 4, another embodiment of an advantageous concatenation of the first stack ST1 and the second stack ST2 is formed. In the present case, each of the two stacks ST1 and ST2 has three partial voltage sources. Only the differences from the illustration in FIG. 3 are explained below. The second stack ST2, like the first stack ST1, has a series circuit formed of three diodes with tunnel diodes formed between them. The two stacks ST1 and ST2 are connected in series with one another so that the source voltage VQ1 of the first stack ST1 and the source voltage VQ2 of the second stack ST2 add together as long as the two stacks ST1 and ST2 are exposed to the photon flux L.

In an embodiment that is not shown, the two stacks ST1 and ST2 have different numbers of diodes from one another, which are connected in a series circuit in each case. In another embodiment that is not shown, at least the first stack ST1 and/or the second stack ST2 has more than three diodes connected in a series circuit. In this way, the voltage level of the voltage source VQ can be scaled. Preferably the number N is in a range between four and eight. In an additional embodiment that is not shown, the two stacks ST1 and ST2 are connected in parallel to one another.

Figure 5:
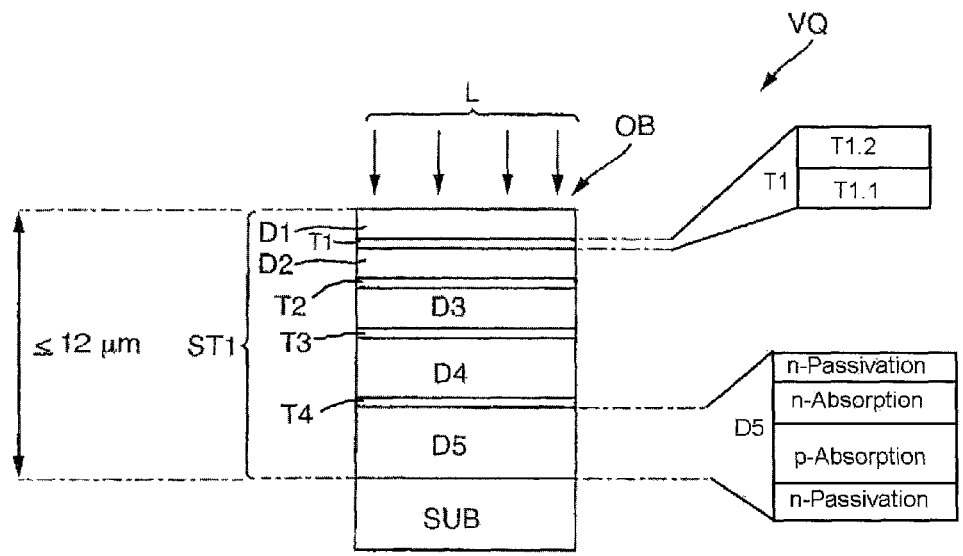
FIG. 5 shows an embodiment with a total of five diodes with different absorption region thicknesses.

Shown in the illustration in FIG. 5 is an embodiment of an advantageous concatenation of semiconductor layers into the first stack ST1. Only the differences from the illustration in FIG. 1 are explained below. The first stack ST1 comprises a total of five partial voltage sources implemented as diodes D1 to D5 connected in series. The photon flux L is incident on the surface OB of the first diode D1. The surface OB is completely or almost completely illuminated. One tunnel diode T1-T4 is formed between each sequential pair of diodes D1-D5. The thickness of the absorption region increases with increasing distance of the individual diodes D1 to D5 from the surface OB, so that the bottommost diode D5 has the thickest absorption region. Taken as a whole, the total thickness of the first stack ST1 is less than or equal to 12 µm. A substrate SUB is formed beneath the bottommost diode D5. The five partial voltage sources implemented as semiconductor diodes D1-D5 are connected to one another in series, each of the partial voltage sources having a semiconductor diode D1-D5 with a p-n junction. For example, the semiconductor diode D5 has a p-doped absorption layer, the p absorption layer being passivated by a p-doped passivation layer with a larger band gap than the band gap of the p absorption layer and the semiconductor diode having an n absorption layer, the n absorption layer being passivated by an n-doped passivation layer with a larger band gap than the band gap of the n absorption layer. The partial source voltages of the individual partial voltage sources have a deviation of less than 20% from one another.

Additionally, tunnel diodes T1-T4 are formed between sequential pairs of partial voltage sources, the tunnel diodes having multiple semiconductor layers, for example T1.1 and T1.2, with a larger band gap than the band gap of the p/n absorption layers of the semiconductor diodes D1-D5. The semiconductor layers with the larger band gap are each made of a material with modified stoichiometry and/or a different elemental composition than the p/n absorption layers of the semiconductor diodes. The partial voltage sources or semiconductor diodes D1-D5 and the tunnel diodes T1-T4 are monolithically integrated together, and jointly form a first stack with a top and a bottom, and the number N of partial voltage sources is greater than or equal to two. The photon flux L strikes the first stack on the top and the size of the illumination area on the stack top is essentially the size of the area of the first stack ST1 at the top, and the first stack has a total thickness of less than 12 µm, and at 300 K the first stack has a source voltage of greater than 2.2 volts as long as the first stack is irradiated with a photon flux L. The total thickness of the p and n absorption layers of a semiconductor diode increases from the topmost semiconductor diode D1 to the bottommost semiconductor diode D5 in the direction of incident light from the top of the first stack to the bottom of the first stack ST1.

Figure 6:
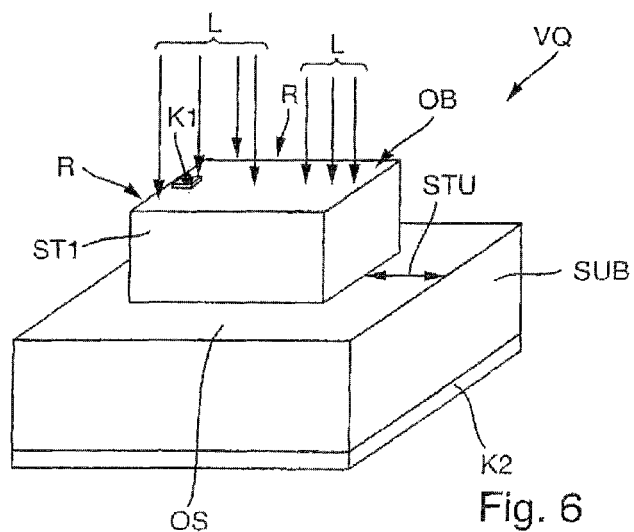
FIG. 6 shows a stack with a continuous, step-like shoulder.

Shown in the illustration in FIG. 6 is an embodiment of an advantageous concatenation of semiconductor layers into the first stack ST1 with a continuous step-like shoulder. Only the differences from the illustration in FIG. 3 are explained below. A first metal terminal contact K1 is formed on the surface OB of the first stack ST1 at the edge R. The first terminal contact K1 is connected to the first voltage terminal VSUP1—not shown. The substrate SUB has a top OS, wherein the top OS of the substrate SUB is integrally joined to the bottommost diode, which is to say the fifth diode D5. It is a matter of course here that a thin nucleation layer and a buffer layer are epitaxially produced on the substrate before the fifth diode is arranged on the substrate and integrally joined to the top OS of the substrate. The top OS of the substrate SUB has a larger surface than the area at the bottom of the first stack ST1. In this way, a continuous shoulder STU is formed. The edge of the shoulder STU is more than 5 µm and less than 500 µm distant from the immediately adjacent lateral face of the first stack ST1 of the shoulder, shown as the length of the reference character STU. The height of the lateral face of the shoulder STU is greater than 100 nm. A second, full-area metal contact K2 is formed on the bottom of the substrate SUB. The second terminal contact K2 is connected to the second voltage terminal VSUP2—not shown.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A scalable voltage source comprising:
   a number N of partial voltage sources formed as semiconductor diodes connected to one another in series, each of the partial voltage sources having a semiconductor diode with a p-n junction, the semiconductor diode having a p-doped absorption layer and having an n absorption layer, the n absorption layer being passivated by an n-doped passivation layer with a larger band gap than a band gap of the n absorption layer, the partial source voltages of the individual partial voltage sources having a deviation of less than 20% from one another; and a tunnel diode formed between sequential pairs of partial voltage sources, the tunnel diode having multiple semiconductor layers with a larger band gap than the band gap of the p absorption layer and the n absorption layer, the semiconductor layers with the larger band gap being each made of a material with modified stoichiometry and/or a different elemental composition than the p/n p absorption layer and the n absorption layer of the semiconductor diode, wherein the partial voltage sources and the tunnel diodes are monolithically integrated together and jointly form a first stack with a top and a bottom, the number N of partial voltage sources being greater than or equal to two, wherein, at an illumination of the first stack with light, the light strikes the first stack on a surface on the top and a size of the illuminated surface on the first stack top corresponds essentially to a size of an area of the first stack at the top, wherein the first stack has a thickness of less than 12 µm, wherein at 300 K the first stack has a source voltage of greater than 2.2 volts as long as the first stack is irradiated with light, wherein a total thickness of the p and n absorption layers of a semiconductor diode increases from the topmost semiconductor diode to the bottommost semiconductor diode in a direction of incident light from the top of the first stack to the bottom of the first stack, wherein each p absorption layer of the semiconductor diode is passivated by a p-doped passivation layer with a larger band gap than the band gap of the p absorption layer, and wherein a continuous shoulder is formed in a vicinity of the bottom of the first stack and a height of the shoulder is greater than 100 nm.

2. The scalable voltage source according to claim 1, wherein the partial source voltages of the partial voltage sources have a deviation of less than 10% from one another.

3. The scalable voltage source according to claim 1, wherein the semiconductor diodes each have the same semiconductor material.

4. The scalable voltage source according to claim 1, wherein a first voltage terminal is formed on the top of the first stack as a continuous first metal contact in a vicinity of an edge or as a single contact area on the edge.

5. The scalable voltage source according to claim 1, wherein a second stack is formed, and the first stack and the second stack are arranged next to one another on a shared carrier, and wherein the two stacks are connected to one another in series such that the source voltage of the first stack and the source voltage of the second stack add together.

6. The scalable voltage source according to claim 1, wherein a semiconductor mirror is formed below the bottommost semiconductor diode of the first stack.

7. The scalable voltage source according to claim 1, wherein the semiconductor layers of the first stack comprises arsenide-containing layers and phosphide-containing layers.

8. The scalable voltage source according to claim 1, wherein a corner of the first stack has a minimum of 5 µm and a maximum of 500 µm of spacing from an immediately adjacent lateral face of a substrate.

9. The scalable voltage source according to claim 1, wherein exactly two semiconductor diodes are arranged on a germanium substrate, and the semiconductor diodes each include an InGaAs compound lattice-matched to a Ge substrate as an absorption material.

10. The scalable voltage source according to claim 1, wherein the first stack has a base area smaller than 2 mm$^2$ or smaller than 1 mm$^2$.

11. The scalable voltage source according to claim 10, wherein the base area is quadrilateral in design.

12. The scalable voltage source according to claim 1, wherein a second voltage terminal is formed on the bottom of the first stack.

13. The scalable voltage source according to claim 12, wherein the second voltage terminal is formed by a substrate.

14. The scalable voltage source according to claim 1, wherein the first stack is arranged on a substrate, and wherein the substrate comprises a semiconductor material.

15. The scalable voltage source according to claim 14, wherein the semiconductor material and/or the substrate are formed of III-V materials.

16. The scalable voltage source according to claim 14, wherein the substrate includes germanium or gallium arsenide.

17. The scalable voltage source according to claim 1, wherein an intrinsic layer is formed between the p absorption layer and the n absorption layer in at least one semiconductor diode.

18. The scalable voltage source according to claim 17, wherein the intrinsic layer is formed at the bottommost semiconductor diode.

19. The scalable voltage source according to claim 17, wherein the intrinsic layer is formed at all semiconductor diodes.

* * * * *